(12) United States Patent
Narushima et al.

(10) Patent No.: US 11,629,404 B2
(45) Date of Patent: Apr. 18, 2023

(54) METHOD OF FORMING TUNGSTEN FILM AND CONTROLLER

(71) Applicant: TOKYO ELECTRON LIMITED, Tokyo (JP)

(72) Inventors: Kensaku Narushima, Nirasaki (JP); Nagayasu Hiramatsu, Hillsboro, OR (US); Atsushi Matsumoto, Nirasaki (JP); Takanobu Hotta, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 395 days.

(21) Appl. No.: 16/353,227

(22) Filed: Mar. 14, 2019

(65) Prior Publication Data

US 2019/0292656 A1  Sep. 26, 2019

(30) Foreign Application Priority Data

Mar. 26, 2018  (JP) .............................. JP2018-057961

(51) Int. Cl.
| | |
|---|---|
| *C23C 16/04* | (2006.01) |
| *C23C 16/02* | (2006.01) |
| *C23C 16/52* | (2006.01) |
| *C23C 16/455* | (2006.01) |
| *C23C 16/34* | (2006.01) |
| *C23C 16/08* | (2006.01) |

(52) U.S. Cl.
CPC ........ *C23C 16/045* (2013.01); *C23C 16/0272* (2013.01); *C23C 16/08* (2013.01); *C23C 16/34* (2013.01); *C23C 16/45529* (2013.01); *C23C 16/52* (2013.01)

(58) Field of Classification Search
CPC ... C23C 16/045; C23C 16/0272; C23C 16/08; C23C 16/34; C23C 16/45529; C23C 16/52
See application file for complete search history.

(56) References Cited

U.S. PATENT DOCUMENTS

| | | | | |
|---|---|---|---|---|
| 5,926,737 | A * | 7/1999 | Ameen | ............. H01L 21/28518 |
| | | | | 257/E21.311 |
| 6,287,964 | B1 * | 9/2001 | Cho | .................. H01L 21/76877 |
| | | | | 438/643 |
| 2015/0348840 | A1 * | 12/2015 | Bamnolker | ............. C23C 16/14 |
| | | | | 438/669 |

FOREIGN PATENT DOCUMENTS

| | | | | |
|---|---|---|---|---|
| CN | 101606228 | A | | 12/2009 |
| CN | 105280549 | A | | 1/2016 |
| JP | 2001-267418 | A | | 9/2001 |
| JP | 2004-128239 | A | | 4/2004 |
| JP | 2008192835 | A | * | 8/2008 ....... H01L 21/76843 |
| JP | 2009-26864 | A | | 2/2009 |

(Continued)

*Primary Examiner* — Kelly M Gambetta
(74) *Attorney, Agent, or Firm* — Nath, Goldberg & Meyer; Jerald L. Meyer; Tanya E. Harkins (57) ABSTRACT

A method of forming a tungsten film in a penetration portion provided in a film formed on a surface of a base so as to expose the surface of the base includes: forming a barrier metal film made of a nitride of a transition metal in the penetration portion such that the barrier metal film formed on the exposed surface of the base is thicker than the barrier metal film formed on a side wall of the penetration portion; and selectively forming the tungsten film on the exposed surface of the base by supplying a tungsten chloride gas and a reducing gas for reducing the tungsten chloride gas to the penetration portion.

11 Claims, 9 Drawing Sheets

(56) References Cited

FOREIGN PATENT DOCUMENTS

JP       2015-514160 A    5/2015
WO     2015080058 A1    6/2015

\* cited by examiner

METHOD OF FORMING TUNGSTEN FILM AND CONTROLLER

CROSS-REFERENCE TO RELATED APPLICATION

This application is based upon and claims the benefit of priority from Japanese Patent Application No. 2018-057961, filed on Mar. 26, 2018, the entire contents of which are incorporated herein by reference.

TECHNICAL FIELD

The present disclosure relates to a method of forming a tungsten film and a controller.

BACKGROUND

A film-forming method capable of embedding a tungsten film without generating a void inside a trench or hole having a high aspect ratio is known in the related art.

SUMMARY

However, in the above film-forming method, it is difficult to embed a tungsten film without generating a void inside a trench or hole when the trench or hole has a complicated shape (e.g., a barrel shape).

The present disclosure provides a technique capable of forming a tungsten film without generating a void inside a trench or hole.

According to an embodiment of the present disclosure, there is provided a method of forming a tungsten film in a penetration portion provided in a film formed on a surface of a base so as to expose the surface of the base is provided. The method includes: forming a barrier metal film made of a nitride of a transition metal in the penetration portion such that the barrier metal film formed on the exposed surface of the base is thicker than the barrier metal film formed on a side wall of the penetration portion; and selectively forming a tungsten film on the exposed surface of the base by supplying a tungsten chloride gas and a reducing gas for reducing the tungsten chloride gas to the penetration portion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will now be described with reference to the accompanying drawings. In all the accompanying drawings, the same or corresponding members or components will be denoted by the same or corresponding reference numerals, and redundant explanations will be omitted.

[Method of Forming Tungsten Film]

Figure 1:
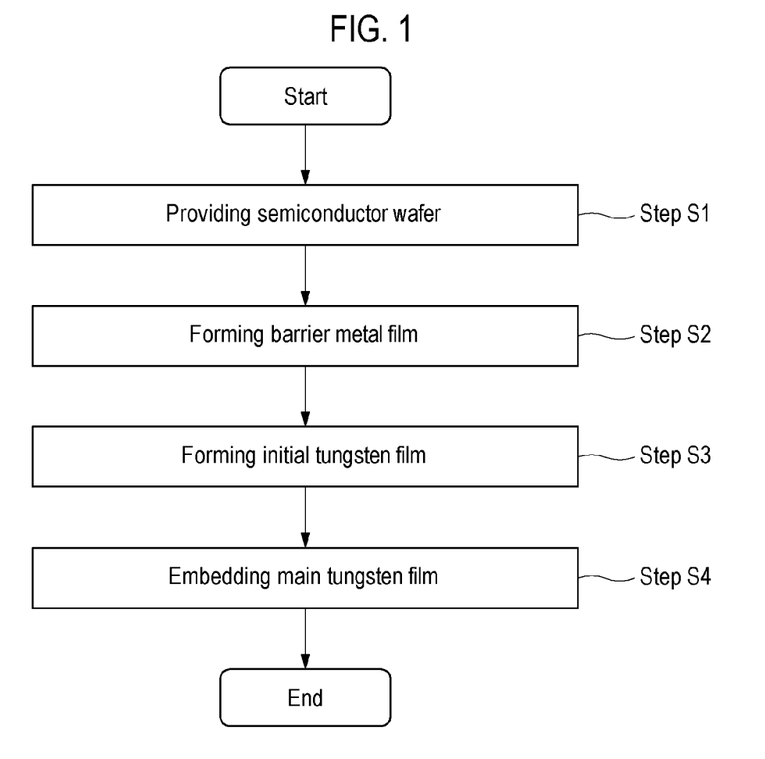
FIG. 1 is a flowchart illustrating an exemplary method of forming a tungsten film.

A method of forming a tungsten film according to an embodiment of the present disclosure is a method of forming a tungsten film in a penetration portion provided in a film formed on a surface of a base to expose the surface of the base. FIG. 1 is a flowchart illustrating an exemplary method of forming a tungsten film.

As illustrated in FIG. 1, a method of forming a tungsten film includes a step of providing a semiconductor wafer (step S1), a step of forming a barrier metal film (step S2), a step of forming an initial tungsten film (step S3), and a step of embedding a main tungsten film (step S4).

Hereinafter, steps S1 to S4 will be described in detail. FIGS. 2A to 2D are cross-sectional process views illustrating an exemplary method of forming a tungsten film.

Figure 2A:
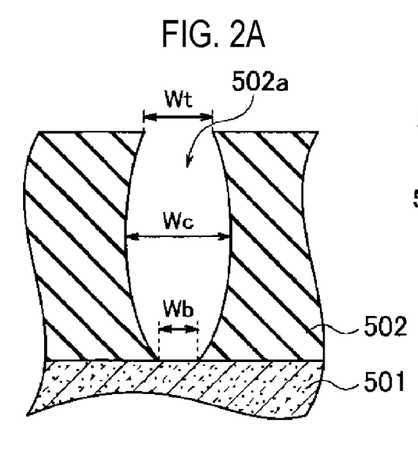
FIGS. 2A to 2D are cross-sectional process views illustrating an exemplary method of forming a tungsten film.

First, as illustrated in FIG. 2A, a semiconductor wafer is provided in which a film 502 is provided on a base 501 and is provided with a penetration portion 502a to expose a surface of the base 501 (step S1). The base 501 and the film 502 are formed by a combination of materials in which incubation time of a barrier metal film 503 on the surface of the base 501 is shorter than incubation time of the barrier metal film 503 on the surface of the film 502. The base 501 may be, for example, silicon or metal silicide. Examples of the metal silicide include nickel (Ni) silicide, cobalt (Co) silicide, titanium (Ti) silicide, and tungsten (W) silicide. The film 502 may be an insulating film such as a silicon oxide film ($SiO_2$ film) or a silicon nitride film (SiN film). The penetration portion 502a is formed to have, for example, a barrel shape in cross section in which a width Wc of a central portion of the film 502 is wider than a width Wt of a portion at the same side as a surface (an upper portion) and a width Wb of a lower portion of the film 502. However, the penetration portion 502a may be formed to have, for example, a diamond shape in cross section in which the width Wc of the central portion of the film 502 is wider than the width Wt of the upper portion and the width Wb of the lower portion of the film 502. Further, the penetrating portion 502a may be formed to have, for example, a V shape in cross section in which Wt>Wc>Wb, or a rectangular shape in cross section in which Wt=Wc=Wb. As described above, the cross-sectional shape of the penetration portion 502a is not limited. The penetration portion 502a may be, for example, a trench or a hole.

Figure 2B:
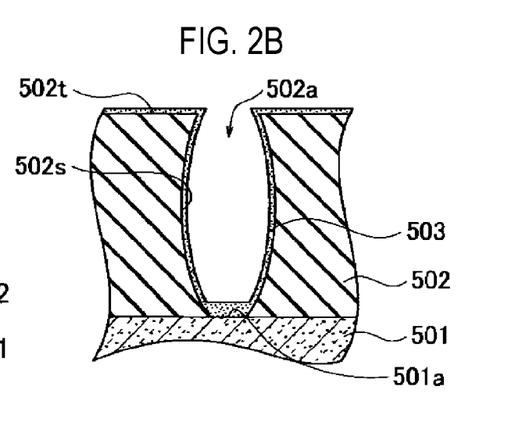

Subsequently, a barrier metal film 503 is formed in the penetration portion 502a through an Atomic Layer Deposition (ALD) method or a Chemical Vapor Deposition (CVD) method (step S2). At this time, incubation time of the barrier metal film 503 on the base 501 is shorter than incubation time of the barrier metal film 503 on the film 502. As a result, as illustrated in FIG. 2B, the barrier metal film 503 formed on the exposed surface 501a of the base 501 is thicker than that on the side wall 502s and the upper portion 502t of the penetration portion 502a. The barrier metal film 503 is formed of a nitride of a transition metal. The barrier metal film 503 may be, for example, a titanium nitride film (TiN film) or a tantalum nitride film (TaN film). For example, a TiN film may be formed on a semiconductor wafer having the base 501 and the film 502 formed thereon through an ALD method or a CVD method using a Ti-containing gas (e.g., $TiCl_4$ gas) and a nitriding gas (e.g., $NH_3$ gas).

Figure 2C:
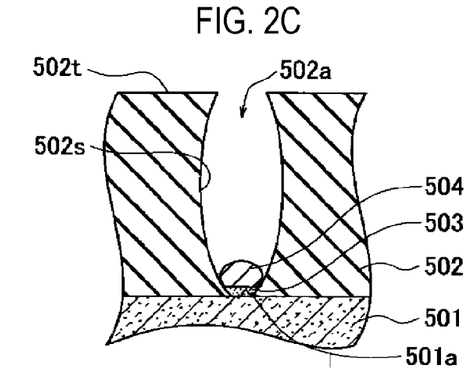

Subsequently, tungsten chloride gas and a reducing gas for reducing tungsten chloride gas are supplied to the penetration portion 502a where the barrier metal film 503 is formed through the ALD method or the CVD method, and an initial tungsten film 504 is formed in the penetration portion 502a (step S3). At this time, the tungsten chloride gas has a property in which the tungsten chloride gas slightly etches the nitride of the transition metal constituting the barrier metal film 503 and has a property that easily allows the tungsten film to grow selectively from the surface of the nitride of the transition metal constituting the barrier metal film 503. Therefore, as illustrated in FIG. 2C, the barrier metal film 503, which has been formed relatively thinly on the side wall 502s and the upper portion 502t of the penetration portion 502a, is etched and removed. Meanwhile, the barrier metal film 503, which has been formed relatively thickly on the exposed surface 501a of the base 501, partially remains. As a result, an initial tungsten film 504 is selectively formed using the barrier metal film 503 remaining on the exposed surface 501a of the base 501 as a base point. The tungsten chloride gas may be, for example, tungsten hexachloride ($WCl_6$) gas or tungsten pentachloride ($WCl_5$) gas. The tungsten chloride gas may be generated by sublimating a film forming material that is solid at normal temperature, or may be generated by vaporizing a film forming material that is liquid at room temperature. The reducing gas may be any reducing gas containing hydrogen, and examples thereof include hydrogen ($H_2$) gas, monosilane ($SiH_4$) gas, diborane ($B_2H_6$) gas, ammonia ($NH_3$) gas, phosphine ($PH_3$) gas, dichlorosilane ($SiH_2Cl_2$) gas. In addition, two or more gases selected from the group of $H_2$ gas, $SiH_4$ gas, $B_2H_6$ gas, $NH_3$ gas, $PH_3$ gas, and $SiH_2Cl_2$ gas may be combined. However, from the viewpoint of further reducing impurities in the tungsten film to obtain a low resistance value, $H_2$ gas may be used in some embodiments.

Figure 2D:
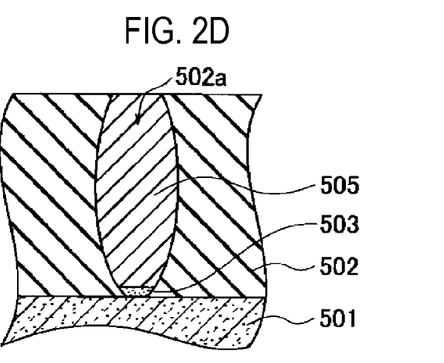

Subsequently, a main tungsten film 505 is formed on the initial tungsten film 504 grown on the surface of the base 501 through the ALD method or the CVD method until the penetration portion 502a is embedded (step S4). At this time, as illustrated in FIG. 2D, the main tungsten film 505 is grown on the initial tungsten film 504 formed in the step S3 from the lower side to the upper side of the penetration portion 502a. As a result, a tungsten film is formed without generating a void inside the penetration portion 502a. In step S4, the main tungsten film 505 may be formed under the same process conditions as in step S3, or the main tungsten film 505 may be formed under process conditions different from those of step S3. Examples of the different process conditions may include a CVD method or an ALD method using, for example, tungsten fluoride gas instead of the tungsten chloride gas.

As described above, according to the method of forming a tungsten film according to an embodiment of the present disclosure, first, a barrier metal film 503 formed of a nitride of a transition metal is formed in the penetration portion 502a such that the barrier metal film 503 is formed more thickly on the exposed surface 501a of the base 501 than on the side wall 502s and the upper portion 502t of the penetration portion 502a. Subsequently, tungsten chloride gas and a reducing gas for reducing the tungsten chloride gas are supplied to selectively form an initial tungsten film 504 on the exposed surface 501a of the base 501. This makes it possible to grow the main tungsten film 505 from the lower side toward the upper side of the penetration portion 502a. As a result, it is possible to form a tungsten film without generating a void inside the penetration portion 502a.

In contrast, when tungsten fluoride gas is used instead of the tungsten chloride gas in step S3, there is a possibility that not only the barrier metal film on the side wall of the penetration portion but also the barrier metal film formed on the exposed surface of the base to be thicker than that formed on the side wall of the penetration portion may be etched, such that the barrier metal film does not remain. This is because the tungsten fluoride gas exhibits a strong etching property with respect to the nitride of a transition metal. As a result, since it is not possible to selectively form a tungsten film on the exposed surface of the base, it is difficult to form a tungsten film without generating a void inside the penetration portion.

Example

Next, the results of evaluating incubation times of a TiN film on the surface of silicon (Si) and the surface of a $SiO_2$ film will be described.

First, TiN films were formed on a surface of Si by repeating film formation through an ALD method 25 times, 30 times, 35 times, 40 times, and 45 times by alternately supplying a Ti-containing gas (e.g., $TiCl_4$) and a nitrogen-containing gas (e.g., $NH_3$) to the surface of Si. In addition, TiN films were formed on the surface of a $SiO_2$ film by repeating film formation through an ALD method 35 times, 40 times, 45 times, 50 times, and 60 times by alternately supplying a Ti-containing gas (e.g., $TiCl_4$) and a nitrogen-containing gas (e.g., $NH_3$) to the surface of the $SiO_2$ film. Subsequently, each of the film thickness of the TiN film formed on the surface of Si and the film thickness of the TiN film formed on the surface of the $SiO_2$ film was measured at multiple places, and the average film thickness was calculated for each of the film thicknesses.

Figure 3:
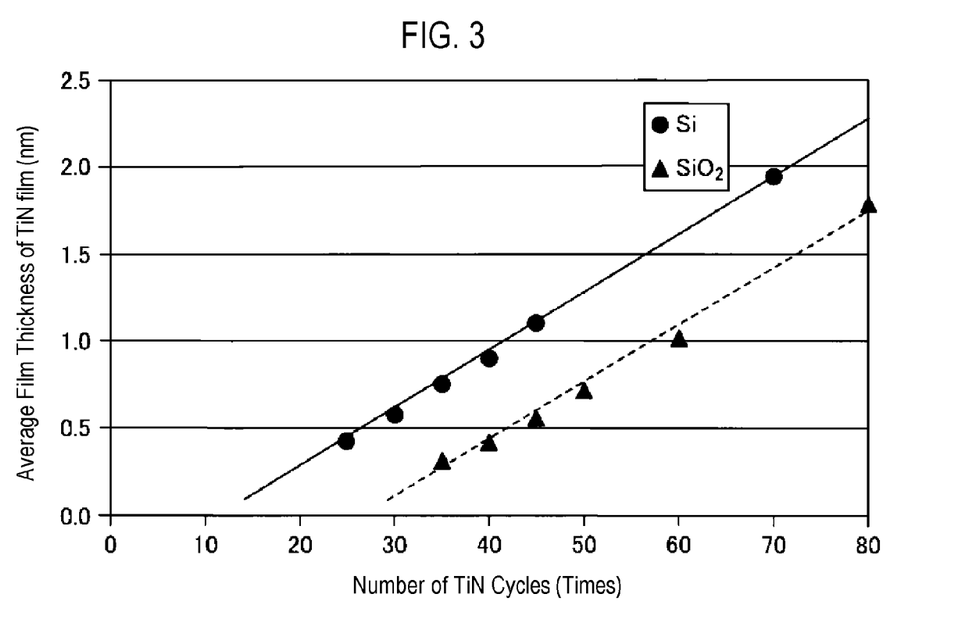
FIG. 3 is a diagram illustrating an exemplary surface dependency of incubation time.

FIG. 3 is a diagram showing an example of surface dependency of the incubation time. In FIG. 3, the horizontal axis represents the number of cycles (times) when the TiN film was formed through the ALD method, and the vertical axis represents the average film thickness (nm) of the TiN film. In addition, a relationship between the number of cycles when the TiN film was formed on the surface of Si and the average film thickness of the TiN film is indicated by circle marks and an approximate line is indicated by a solid line. In addition, a relationship between the number of cycles when the TiN film was formed on the surface of the SiO$_2$ film and the average film thickness of the TiN film is indicated by triangle marks and an approximate line is indicated by a broken line.

As illustrated in FIG. 3, it can be seen that, in the case in which the TiN film was formed on the surface of Si, the growth of TiN was started with a smaller number of cycles than that in the case in which the TiN film was formed on the surface of the SiO$_2$ film. Specifically, when the TiN film was formed on the surface of Si, it is estimated that the growth of the TiN film starts by repeating film formation through an ALD method about 10 to 20 cycles by alternately supplying a Ti-containing gas (e.g., TiCl$_4$) and a nitrogen-containing gas (e.g., NH$_3$) to the surface of Si. Meanwhile, when the TiN film was formed on the surface of the SiO$_2$ film, it is estimated that the growth of the TiN film is initiated by repeating film formation through an ALD method about 25 to 35 cycles by alternately supplying a Ti-containing gas (e.g., TiCl$_4$) and a nitrogen-containing gas (e.g., NH$_3$) to the surface of the SiO$_2$ film. From these facts, the formation of the TiN film is initiated on the surface of Si and the film is selectively formed only on the surface of Si until the formation of the TiN film is initiated on the surface of the SiO$_2$ film (e.g., between 20 and 25 cycles).

According to the results of FIG. 3 described above, it can be said that it is possible to selectively form a TiN film having a predetermined thickness on the surface of Si by repeating the ALD process of cycles, in which a TiN film is formed on the surface of Si and a TiN film is not formed on the surface of SiO$_2$ film, a predetermined number of times.

Next, the results of evaluating the relationship between the film thickness of a TiN film and the film thickness of a tungsten film will be described.

First, a tungsten film was formed through an ALD method using WCl$_6$ gas and H$_2$ gas on each of TiN films having film thicknesses of 0.25 nm, 0.41 nm, 0.58 nm, and 0.95 nm. Subsequently, each of the film thicknesses of the tungsten films formed on the surfaces of the TiN films was measured.

Figure 4:
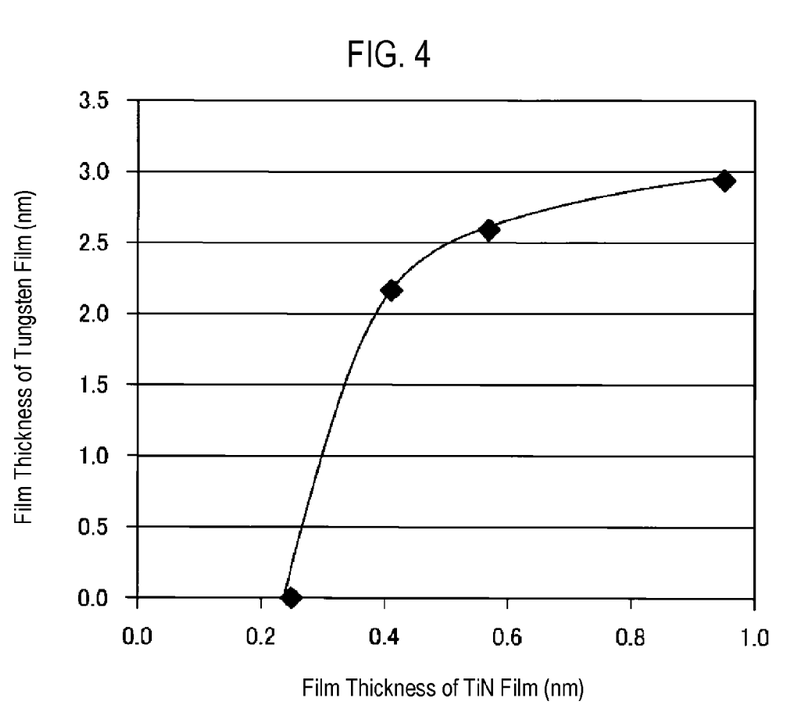
FIG. 4 is a diagram illustrating an exemplary relationship between a film thickness of a TiN film and a film thickness of a tungsten film.

FIG. 4 is a diagram illustrating an exemplary relationship between a film thickness of a TiN film and a film thickness of a tungsten film. In FIG. 4, the horizontal axis represents the thicknesses (nm) of TiN films before a tungsten film is formed thereon and the vertical axis represents the film thicknesses (nm) of tungsten films formed on the surfaces of the TiN films.

As illustrated in FIG. 4, when the film thickness of a TiN film was 0.25 nm, no tungsten film was formed. Meanwhile, when the thicknesses of the TiN films were 0.41 nm, 0.58 nm, and 0.95 nm, the film thicknesses of the tungsten films were 2.2 nm, 2.6 nm, and 2.9 nm, respectively. From this result, it can be seen that when the film thickness of the TiN film is too thin, no tungsten film is formed.

According to the results of FIG. 4 described above, it can be said that in the case in which the base is a silicon substrate and the film is an SiO$_2$ film, a TiN film having a film thickness of 0.25 nm or less may be formed on the side wall of the penetration portion in step S2, and a TiN film having a film thickness of 0.41 nm or more may be formed on the exposed surface of the silicon substrate in some embodiments. This makes it possible to cause a part of the TiN film to remain on the exposed surface of the silicon substrate and to selectively form a tungsten film on the exposed surface of the silicon substrate in step S3.

Next, the etching amount of a TiN film was evaluated when WCl$_6$ gas or WCl$_5$ gas was supplied to the TiN film having a film thickness of 5 nm for a predetermined time under different film formation temperature conditions.

First, in the state in which the film formation temperature is controlled to 400 degrees C., 450 degrees C., 525 degrees C., and 550 degrees C., a tungsten film was formed on the surface of a TiN film having a thickness of 5 nm through the ALD method using WCl$_6$ gas and H$_2$ gas. In addition, in the state in which the film formation temperature is controlled to 400 degrees C., 450 degrees C., 500 degrees C., and 550 degrees C., a tungsten film was formed on the surface of a TiN film having a thickness of 5 nm through the ALD method using WCl$_5$ gas and H$_2$ gas. Subsequently, the thickness of each TiN film etched by forming a tungsten film was measured.

Figure 5:
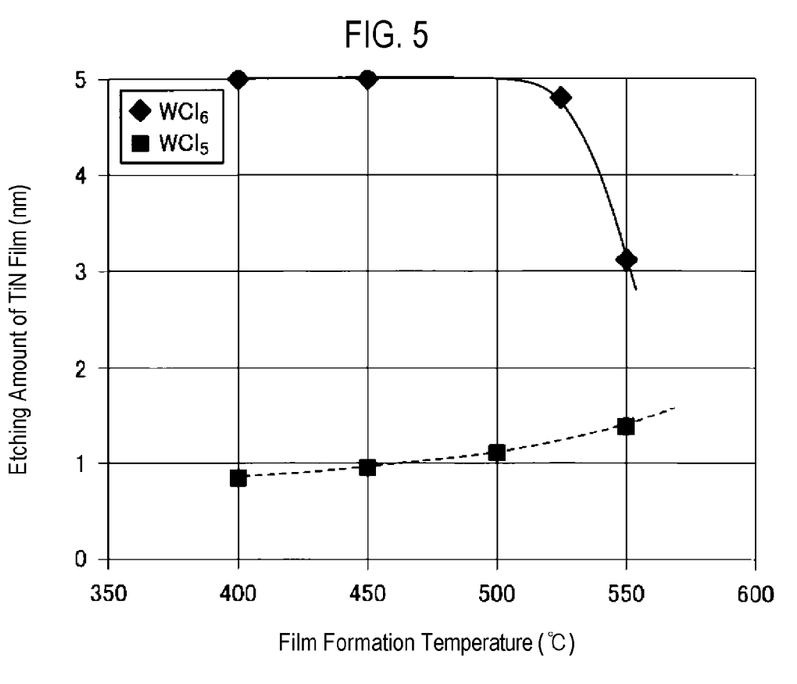
FIG. 5 is a diagram illustrating an exemplary relationship between a film formation temperature of a tungsten film and an etching amount of a TiN film.

FIG. 5 is a diagram illustrating an exemplary relationship between a film formation temperature of a tungsten film and an etching amount of a TiN film. In FIG. 5, the horizontal axis represents a film temperature (degrees C.) of the tungsten film and the vertical axis represents an etching amount (nm) of the TiN film. In addition, the etching amounts of the TiN film when WCl$_6$ gas was used are indicated by diamond marks, and the etching amounts of the TiN film when WCl$_5$ gas was used are indicated by square marks.

As illustrated in FIG. 5, when a tungsten film was formed on the surface of a TiN film through the ALD method using WCl$_6$ gas while controlling the film formation temperature to 400 degrees C. and 450 degrees C., it can be seen that the etching amount of the TiN film was 5 nm and thus the TiN film was completely etched. In addition, when a tungsten film was formed on the surface of a TiN film through the ALD method using WCl$_6$ gas while controlling the film formation temperature to 525 degrees C., it can be seen that the etching amount of the TiN film was about 4.8 nm and thus almost all of the TiN film was etched. In addition, when a tungsten film was formed on the surface of a TiN film through the ALD method using WCl$_6$ gas while controlling the film formation temperature to 550 degrees C., it can be seen that the etching amount of the TiN film was about 3.1 nm. As described above, in the ALD method using WCl$_6$ gas, it is possible to control the etching amount of the TiN film by controlling the film formation temperature.

In addition, when a tungsten film was formed on the surface of a TiN film through the ALD method using WCl$_5$ gas while controlling the film formation temperature to 400 degrees C., 450 degrees C., 500 degrees C., and 550 degrees C., the etching amounts of the TiN film was about 0.8 nm, about 0.9 nm, about 1.1 nm, about 1.4 nm, respectively.

According to the result of FIG. 5 described above, it can be said that it is possible to control the etching amount of a TiN film by controlling a kind of tungsten chloride gas and the film formation temperature at the time of forming a tungsten chloride film.

[Film-Forming Apparatus]

Figure 6:
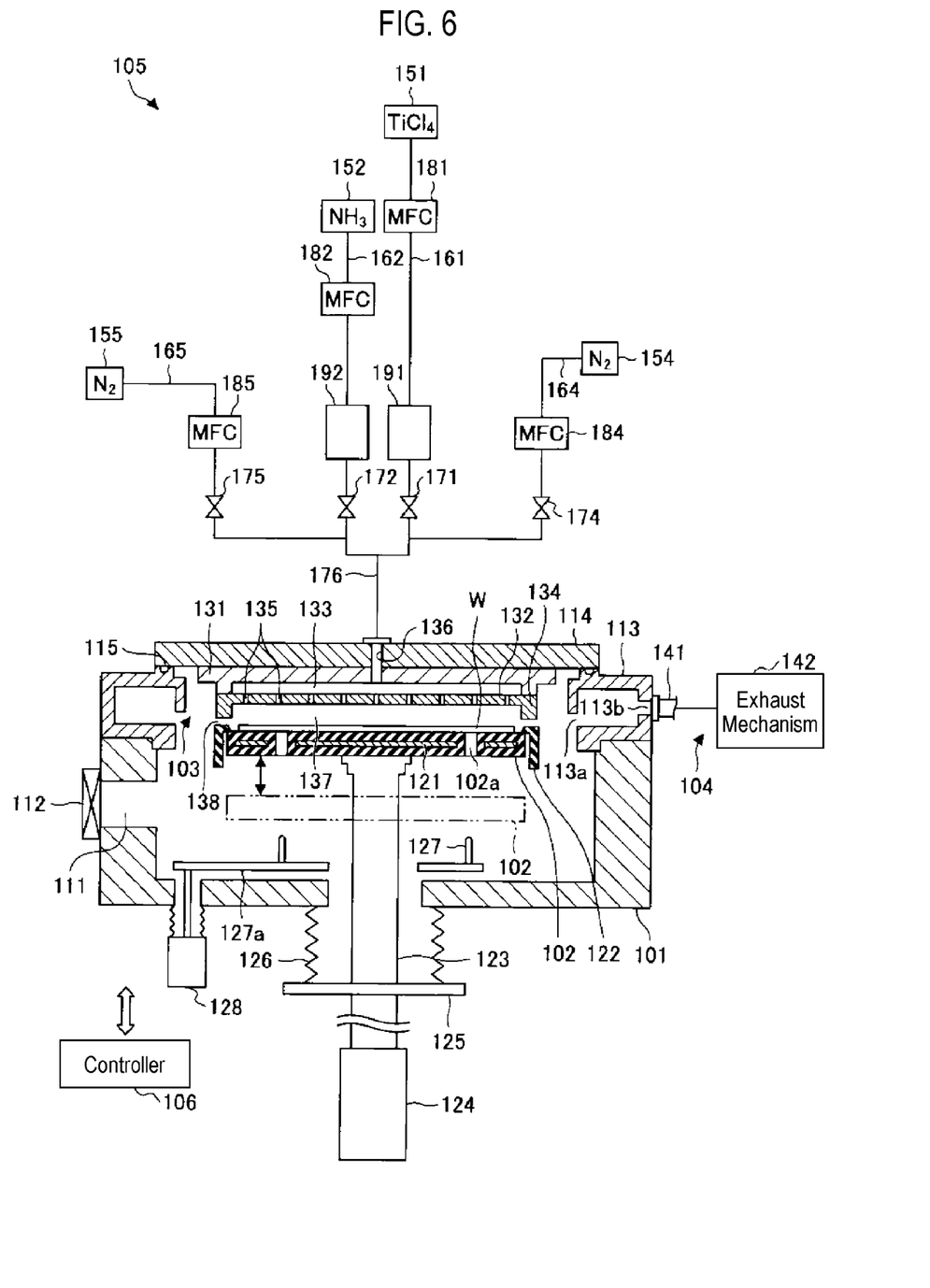
FIG. 6 is a schematic view illustrating an exemplary film forming apparatus for executing a process of forming a TiN film.

FIG. 6 is a schematic view illustrating an exemplary film forming apparatus for executing a process of forming a titanium nitride film as a barrier metal film. The film-forming apparatus of FIG. 6 is an apparatus capable of film formation through an ALD method and film formation through a CVD method, for example. As illustrated in FIG. 6, the film-forming apparatus includes a processing container 101, a susceptor 102, a shower head 103, an exhaust part 104, a processing gas supply mechanism 105, and a controller 106.

The processing container 101 is made of a metal such as aluminum, and has a substantially cylindrical shape. A loading/unloading port 111 is formed in the side wall of the processing container 101 for loading/unloading a semiconductor wafer W, which is an example of a substrate, therethrough, and the loading/unloading port 111 is configured to be opened and closed by a gate valve 112. An annular exhaust duct 113 having a rectangular cross section is provided on the main body of the processing container 101. A slit 113a is formed in the exhaust duct 113 along the inner peripheral surface thereof. In addition, an exhaust port 113b is formed in the outer wall of the exhaust duct 113. On the upper surface of the exhaust duct 113, a ceiling wall 114 is provided so as to close the upper opening of the processing container 101. The space between the ceiling wall 114 and the exhaust duct 113 is hermetically sealed with a seal ring 115.

The susceptor 102 horizontally supports the semiconductor wafer W in the processing container 101. The susceptor 102 has a disk shape having a size corresponding to that of the semiconductor wafer W, and is supported by a support member 123. The susceptor 102 is made of a ceramic material such as aluminum nitride (AlN) or a metal material such as aluminum-based or a nickel-based alloy, and a heater 121 for heating the semiconductor wafer W is embedded in the susceptor 102. The heater 121 is adapted to generate heat by being supplied with power from a heater power supply (not illustrated). Then, by controlling the output of the heater 121 by a temperature signal of a thermocouple (not illustrated) provided in the vicinity of a wafer placement surface of an upper surface of the susceptor 102, the semiconductor wafer W is controlled to a predetermined temperature.

The susceptor 102 is provided with a cover member 122 made of ceramics such as alumina so as to cover the outer peripheral region of the wafer placement surface and the side surface of the susceptor 102.

The support member 123 configured to support the susceptor 102 extends to an area below the processing container 101 through a hole formed in the bottom wall of the processing container 101 from a center of the bottom surface of the susceptor 102, and a lower end of the support member 123 is connected to a lifting mechanism 124. The susceptor 102 is configured to be capable of ascending/descending, via the support member 123 by the lifting mechanism 124, between a processing position illustrated in FIG. 6 and a transport position (indicated by a one-dot chain line below the processing position) where the wafer may be transported. In addition, a flange part 125 is provided on the support member 123 below the processing container 101, and a bellows 126, which partitions the atmosphere in the processing container 101 from an outside air, is provided between the bottom surface of the processing container 101 and the flange part 125 to expand and contract in response to the ascending/descending movement of the susceptor 102.

Three wafer support pins 127 (only two are illustrated) are provided in the vicinity of the bottom surface of the processing container 101 so as to protrude upward from a lifting plate 127a. The wafer support pins 127 are configured to be capable of ascending/descending via the lifting plate 127a by the lifting mechanism 128 provided below the processing container 101, and are inserted into through-holes 102a provided in the susceptor 102 located at the transport position so as to be capable of protruding or receding with respect to the upper surface of the susceptor 102. By causing the wafer support pins 127 to ascend/descend in this manner, the semiconductor wafer W is delivered between a wafer transport mechanism (not illustrated) and the susceptor 102.

The shower head 103 supplies a processing gas into the processing container 101 in a shower form. The shower head 103 is made of metal, is provided to face the susceptor 102, and has a diameter that is substantially the same as that of the susceptor 102. The shower head 103 has a main body part 131 fixed to the ceiling wall 114 of the processing container 101 and a shower plate 132 connected to the lower side of the main body part 131. A gas diffusion space 133 is formed between the main body part 131 and the shower plate 132. In the gas diffusion space 133, a gas introduction hole 136 is provided through a center of the main body part 131 and the ceiling wall 114 of the processing container 101. An annular protrusion 134 protruding downward is formed at a peripheral edge portion of the shower plate 132, and gas ejection holes 135 are formed in a flat surface inside the annular protrusion 134 of the shower plate 132.

In the state in which the susceptor 102 is located at the processing position, a processing space 137 is formed between the shower plate 132 and the susceptor 102, and the annular protrusion 134 and the upper surface of the cover member 122 of the susceptor 102 come close to each other, thus forming an annular gap 138.

The exhaust part 104 evacuates the inside of the processing container 101. The exhaust part 104 includes an exhaust pipe 141 connected to the exhaust port 113b of the exhaust duct 113, and an exhaust mechanism 142 connected to the exhaust pipe 141 and having, for example, a vacuum pump and a pressure control valve. During processing, the gas in the processing container 101 reaches the exhaust duct 113 via the slit 113a, and is exhausted from the exhaust duct 113 through the exhaust pipe 141 by the exhaust mechanism 142 of the exhaust part 104.

The processing gas supply mechanism 105 supplies the processing gas to the shower head 103. The processing gas supply mechanism 105 has a raw material gas supply source 151, a reducing gas supply source 152, a first $N_2$ gas supply source 154, and a second $N_2$ gas supply source 155. The raw material gas supply source 151 supplies, for example, $TiCl_4$ gas, as a metal chloride gas serving as a raw material gas. The reducing gas supply source 152 supplies, for example, $NH_3$ gas as a reducing gas. The first $N_2$ gas supply source 154 and the second $N_2$ gas supply source 155 supply a carrier gas and $N_2$ gas, which is a purge gas.

The processing gas supply mechanism 105 includes a raw material gas supply line 161, a reducing gas supply line 162, a first $N_2$ gas supply line 164, and a second $N_2$ gas supply line 165. The raw material gas supply line 161 is a line extending from the raw material gas supply source 151. The reducing gas supply line 162 is a line extending from the reducing gas supply source 152. The first $N_2$ gas supply line 164 extends from the first $N_2$ gas supply source 154 and supplies $N_2$ gas to the raw material gas supply line 161. The second $N_2$ gas supply line 165 extends from the second $N_2$ gas supply source 155 and supplies $N_2$ gas to the reducing gas supply line 162.

The first $N_2$ gas supply line 164 is a first continuous $N_2$ gas supply line that normally supplies $N_2$ gas during film formation through an ALD method. In addition, the second $N_2$ gas supply line 165 is a second continuous $N_2$ gas supply line that normally supplies $N_2$ gas during film formation through an ALD method. The first $N_2$ gas supply line 164 is connected to the raw material gas supply line 161. The second $N_2$ gas supply line 165 is connected to the reducing gas supply line 162. The raw material gas supply line 161 and the reducing gas supply line 162 join a junction pipe 176, and the junction pipe 176 is connected to the gas introduction hole 136 described above.

On the most downstream sides of the raw material gas supply line 161, the reducing gas supply line 162, the first $N_2$ gas supply line 164, and the second $N_2$ gas supply line 165, opening/closing valves 171, 172, 174, and 175 switching gases during ALD are provided, respectively. Further, on the upstream sides of the opening/closing valves of the raw material gas supply line 161, the reducing gas supply line 162, the first $N_2$ gas supply line 164, and the second $N_2$ gas supply line 165, mass flow controllers 181, 182, 184, and 185 serving as flow rate controllers are provided, respectively. The raw material gas supply line 161 and the reducing gas supply line 162 are provided with buffer tanks 191 and 192, respectively, so that necessary gas can be supplied in a short time.

The controller 106 controls the operation of respective parts of the film-forming apparatus, such as the exhaust part 104 and the processing gas supply mechanism 105. The controller 106 includes a central processing unit (CPU), a read only memory (ROM), and a random access memory (RAM). The CPU executes a desired process according to a recipe stored in a storage region of, for example, a RAM. In the recipe, device control information for a process condition is set. The control information may be, for example, gas flow rate, pressure, temperature, and process time. A recipe and a program used by the controller 6 may be stored in, for example, a hard disk or a semiconductor memory. In addition, for example, the recipe may be set in a predetermined position to be read out in the state of being stored in a storage medium readable by a portable computer, such as a CD-ROM or a DVD.

In the film-forming apparatus configured as described above, a TiN film is formed on the wafer W through the ALD method by alternately and intermittently supplying $TiCl_4$ gas as a raw material gas and $NH_3$ gas as a reducing gas while supplying $N_2$ gas as a purge gas from the processing gas supply mechanism 105 to the processing space 137.

Figure 7:
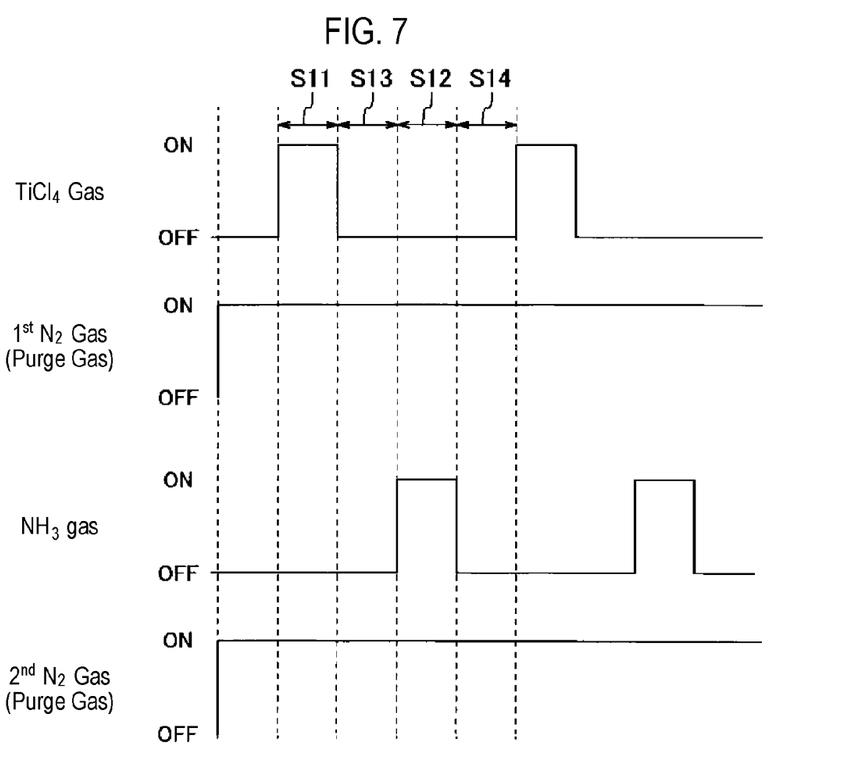
FIG. 7 is a diagram illustrating an exemplary gas supply sequence in an ALD process.

More specifically, as illustrated in FIG. 7, by supplying the $TiCl_4$ gas and the $NH_3$ gas alternately and intermittently while normally supplying first $N_2$ gas from the first $N_2$ gas supply source 154 and second $N_2$ gas from the second $N_2$ gas supply source 155 at a predetermined flow rate as a purge gas, a $TiCl_4$ gas supply step S11 and a $NH_3$ gas supply step S12 are alternately repeated with purge steps S13 and S14, in which only $N_2$ gas is supplied as the purge gas, interposed therebetween. As a result, $TiCl_4$ gas is adsorbed onto the wafer W in the first $TiCl_4$ gas supply step S11, excessive $TiCl_4$ gas is purged in the next purge step S13, $NH_3$ gas supplied in the next $NH_3$ gas supply step S12 is reacted with $TiCl_4$, and the excessive $NH_3$ gas is purged by the next purge step S14 to form a thin unit film which is substantially a monomolecular layer. Such a series of operations are performed multiple times to form a TiN film having a predetermined film thickness.

As described above, it is possible to form a TiN film in a penetration portion in a semiconductor wafer W having a silicon oxide film, which is formed on a silicon film and has the penetration portion formed therein to expose the surface of the silicon film.

Since the incubation time of the TiN film on the silicon film is shorter than the incubation time of the TiN film on the silicon oxide film, the TiN film formed on the exposed surface of the silicon is thicker than the TiN film formed on the side wall of the penetration portion.

Figure 8:
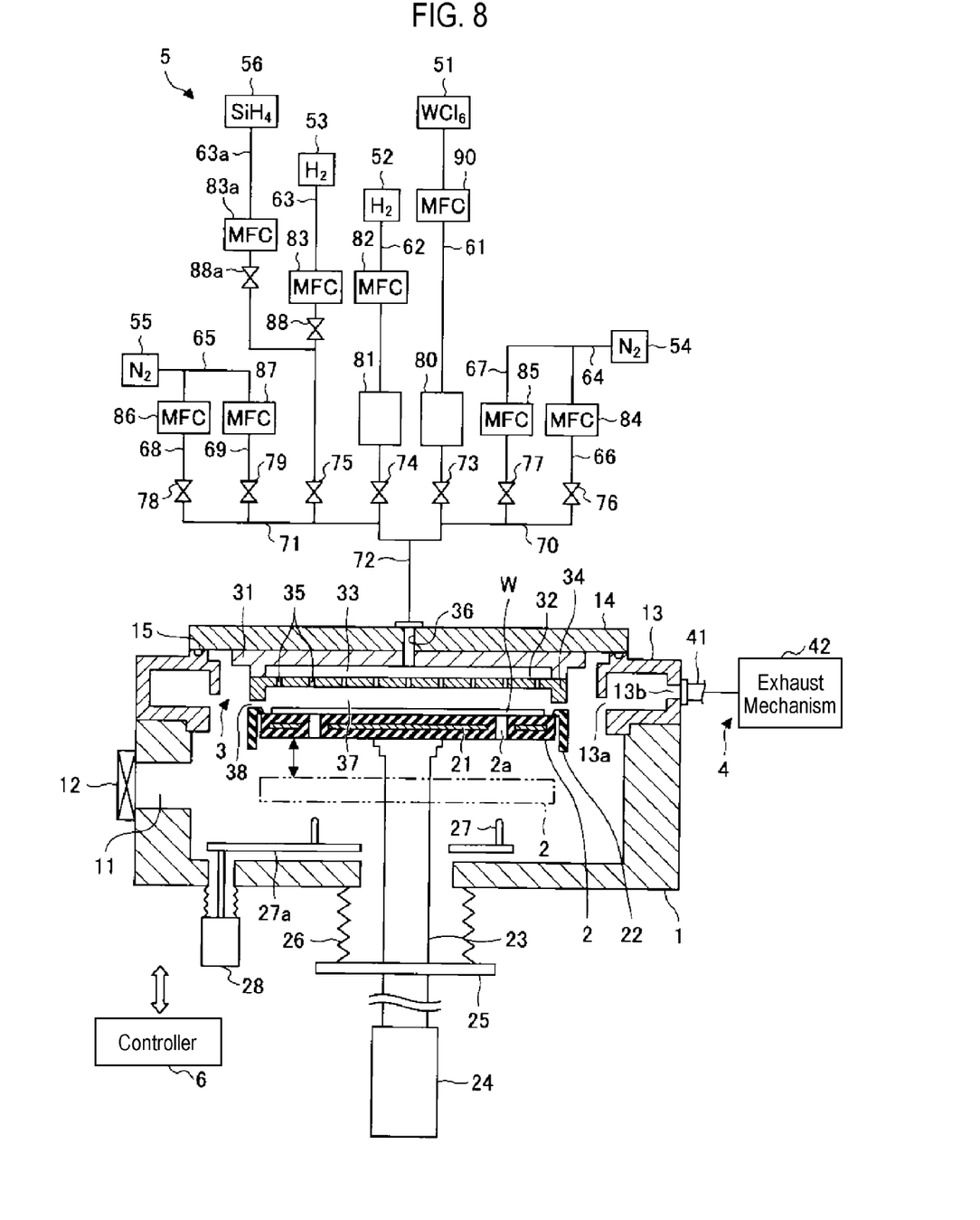
FIG. 8 is a schematic view illustrating an exemplary film forming apparatus for executing a process of forming a tungsten film.

FIG. 8 is a schematic view illustrating an exemplary film forming apparatus for executing a process of forming a tungsten film. The film-forming apparatus of FIG. 8 is an apparatus capable of film formation through an ALD method and film formation through a CVD method, for example. As illustrated in FIG. 8, the film-forming apparatus includes a processing container 1, a susceptor 2, a shower head 3, an exhaust part 4, a processing gas supply mechanism 5, and a controller 6.

The processing container 1 is made of a metal such as aluminum, and has a substantially cylindrical shape. A loading/unloading port 11 is formed in the side wall of the processing container 1 to load/unload a semiconductor wafer W, which is an example of a substrate, therethrough, and the loading/unloading port 11 is configured to be opened and closed by a gate valve 12. An annular exhaust duct 13 having a rectangular cross section is provided on a main body of the processing container 1. A slit 13*a* is formed in the exhaust duct 13 along the inner peripheral surface. In addition, an exhaust port 13*b* is formed in the outer wall of the exhaust duct 13. On the upper surface of the exhaust duct 13, a ceiling wall 14 is provided so as to close the upper opening of the processing container 1. The space between the ceiling wall 14 and the exhaust duct 13 is hermetically sealed with a seal ring 15.

The susceptor 2 horizontally supports the semiconductor wafer W in the processing container 1. The susceptor 2 has a disk shape having a size corresponding to that of the semiconductor wafer W, and is supported by a support member 23. The susceptor 2 is made of a ceramic material such as aluminum nitride (AlN) or a metal material such as aluminum or a nickel-based alloy, and a heater 21 for heating the semiconductor wafer W is embedded in the susceptor 102. The heater 21 is adapted to generate heat by being supplied with power from a heater power supply (not illustrated). Then, by controlling the output of the heater 21 by a temperature signal of a thermocouple (not illustrated) provided in the vicinity of the wafer placement surface of the upper surface of the susceptor 2, the semiconductor wafer W is controlled to a predetermined temperature.

The susceptor 2 is provided with a cover member 22 made of ceramics such as alumina so as to cover the outer peripheral region of the wafer placement surface and the side surface of the susceptor 2.

The support member 23 configure to support the susceptor 2 extends an area below the processing container 1 through a hole formed in a bottom wall of the processing container 1 from a center of a bottom surface of the susceptor 2, and a lower end of the support member 123 is connected to a lifting mechanism 24. The susceptor 2 is configured to be capable of ascending/descending, via the support member 23 by the lifting mechanism 24, between a processing position illustrated in FIG. 8 and a transport position (indicated by a one-dot chain line below the processing position) where the wafer may be transported. In addition, a flange part 25 is provided on the support member 23 below the processing container 1, and a bellows 26, which partitions the atmosphere in the processing container 1 from the outside air, is provided between the bottom surface of the processing container 1 and the flange part 25 to expand and contract in response to the ascending/descending movement of the susceptor 2.

Three wafer support pins 27 (only two are illustrated) are provided in the vicinity of the bottom surface of the processing container 1 so as to protrude upward from a lifting plate 27*a*. The wafer support pins 27 are configured to be capable of ascending/descending via a lifting plate 27*a* by a lifting mechanism 28 provided below the processing container 1, and are inserted into through-holes 2*a* provided in the susceptor 2 located at the transport position so as to be capable of protruding or receding with respect to the upper surface of the susceptor 2. By causing the wafer support pins 27 to ascend/descend in this manner, the semiconductor wafer W is delivered between a wafer transport mechanism (not illustrated) and the susceptor 2.

The shower head 3 supplies a processing gas into the processing container 1 in a shower form. The shower head 3 is made of metal, is provided to face the susceptor 2, and has a diameter that is substantially the same as that of the susceptor 2. The shower head 3 has a main body part 31 fixed to a ceiling wall 14 of the processing container 1 and a shower plate 32 connected to a lower side of the main body part 31. A gas diffusion space 33 is formed between the main body part 31 and the shower plate 32. In the gas diffusion space 33, a gas introduction hole 36 is provided to pass through the center of the main body part 31 and the ceiling wall 14 of the processing container 1. An annular protrusion 34 protruding downward is formed at the peripheral edge portion of the shower plate 32, and gas ejection holes 35 are formed in the flat surface inside the annular protrusion 34 of the shower plate 32.

In the state in which the susceptor 2 is located at the processing position, a processing space 37 is formed between the shower plate 32 and the susceptor 2, and the annular protrusion 34 and the upper surface of the cover member 22 of the susceptor 2 come close to each other, thus forming an annular gap 38.

The exhaust part 4 evacuates the inside of the processing container 1. The exhaust part 4 includes an exhaust pipe 41 connected to the exhaust port 13b of the exhaust duct 13, and an exhaust mechanism 42 connected to the exhaust pipe 41 and having, for example, a vacuum pump and a pressure control valve. During processing, the gas in the processing container 1 reaches the exhaust duct 13 via the slit 13a, and is exhausted from the exhaust duct 13 through the exhaust pipe 41 by the exhaust mechanism 42 of the exhaust part 4.

The processing gas supply mechanism 5 supplies the processing gas to the shower head 3. The processing gas supply mechanism 5 includes a raw material gas supply source 51, a first $H_2$ gas supply source 52, a second $H_2$ gas supply source 53, a first $N_2$ gas supply source 54, a second $N_2$ gas supply source 55, and a $SiH_4$ gas supply source 56. The raw material gas supply source 51 supplies, for example, $WCl_6$ gas, as a metal chloride gas serving as a raw material gas. The raw material gas supply source 51 heats, for example, $WCl_6$, which is a solid raw material and is solid at the room temperature, to an appropriate temperature to sublimate $WCl_6$ to generate $WCl_6$ gas. The first $H_2$ gas supply source 52 supplies $H_2$ gas as a first reducing gas. The second $H_2$ gas supply source 53 supplies $H_2$ gas as an additive reducing gas. The first $N_2$ gas supply source 54 and the second $N_2$ gas supply source 55 supply a carrier gas and $N_2$ gas, which is a purge gas. The $SiH_4$ gas supply source 56 supplies $SiH_4$ gas as a second reducing gas.

The processing gas supply mechanism 5 includes a raw material gas supply line 61, a first $H_2$ gas supply line 62, a second $H_2$ gas supply line 63, a first $N_2$ gas supply line 64, a second $N_2$ gas supply line 65, and a $SiH_4$ gas supply line 63a. The raw material gas supply line 61 is a line extending from the raw material gas supply source 51. The first $H_2$ gas supply line 62 extends from the first $H_2$ gas supply source 52. The second $H_2$ gas supply line 63 extends from the second $H_2$ gas supply source 53. The first $N_2$ gas supply line 64 extends from the first $N_2$ gas supply source 54 and supplies $N_2$ gas to the raw material gas supply line 61. The second $N_2$ gas supply line 65 extends from the second $N_2$ gas supply source 55, and supplies $N_2$ gas to the first $H_2$ gas supply line 62. The $SiH_4$ gas supply line 63a is provided to extend from the $SiH_4$ gas supply source 56 and to be connected to the second $H_2$ gas supply line 63.

The first $N_2$ gas supply line 64 is branched into a first continuous $N_2$ gas supply line 66 that normally supplies $N_2$ gas during film formation through the ALD method and a first flash purge line 67 that supplies $N_2$ gas only during the purge step. In addition, the second $N_2$ gas supply line 65 is branched into a second continuous $N_2$ gas supply line 68 that normally supplies $N_2$ gas during film formation through the ALD method and a second flash purge line 69 that supplies $N_2$ gas only during the purge step. The first continuous $N_2$ gas supply line 66 and the first flash purge line 67 are connected to a first connection line 70, and the first connection line 70 is connected to the raw material gas supply line 61. Further, the second $H_2$ gas supply line 63, the second continuous $N_2$ gas supply line 68, and the second flash purge line 69 are connected to the second connection line 71, and the second connection line 71 is connected to the first $H_2$ gas supply line 62. The raw material gas supply line 61 and the first $H_2$ gas supply line 62 join a junction pipe 72, and the junction pipe 72 is connected to the gas introduction hole 36 described above.

On the most downstream sides of the raw material gas supply line 61, the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, opening/closing valves 73, 74, 75, 76, 77, 78, and 79 for switching gases during ALD are provided, respectively. On the most upstream sides of opening/closing valves of the raw material gas supply line 61, the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, mass flow controllers 90, 82, 83, 84, 85, 86, and 87 as flow rate controllers are provided, respectively. The mass flow controller 83 is provided on the upstream side of the junction point of the $SiH_4$ gas supply line 63a in the second $H_2$ gas supply line 63, and an opening/closing valve 88 is provided between the mass flow controller 83 and the junction point. In addition, the $SiH_4$ gas supply line 63a is provided with a mass flow controller 83a and an opening/closing valve 88a in this order from the upstream side. Therefore, it becomes possible to supply either or both of $H_2$ gas and $SiH_4$ gas via the second $H_2$ gas supply line 63. The raw material gas supply line 61 and the first $H_2$ gas supply line 62 are provided with buffer tanks 80 and 81, respectively, so that necessary gas can be supplied in a short time.

The controller 6 controls the operation of respective parts of the film-forming apparatus, such as the exhaust part 4 and the processing gas supply mechanism 5. The controller 6 includes a central processing unit (CPU), a read only memory (ROM), and a random access memory (RAM). The CPU executes a desired process according to a recipe stored in a storage region of, for example, a RAM. In the recipe, device control information for a process condition is set. The control information may be, for example, gas flow rate, pressure, temperature, and process time. A recipe and a program used by the controller 6 may be stored in, for example, a hard disk or a semiconductor memory. In addition, for example, the recipe may be set in a predetermined position to be read out in the state of being stored in a storage medium readable by a portable computer, such as a CD-ROM or a DVD.

Next, descriptions will be made of the operation when forming a tungsten film in a penetration portion in a semiconductor wafer W such that a TiN film formed on the exposed surface of a silicon film is thicker than that formed on the side wall of the penetration portion, using the film-forming apparatus configured as described above. The following operation is executed when the controller 6 controls each part of the film-forming apparatus.

First, a semiconductor wafer W is loaded into the processing container 1. Specifically, the gate valve 12 is opened in the state in which the susceptor 2 is lowered to the transport position, and the semiconductor wafer W is loaded into the processing container 1 via the loading/unloading port 11 by a transport device (not illustrated) and is placed on the susceptor 2 heated to a predetermined temperature by the heater 21. Subsequently, the susceptor 2 is raised to the processing position, and the inside of the processing container 1 is decompressed to a predetermined degree of vacuum. Thereafter, the opening/closing valves 76 and 78 are opened, and the opening/closing valves 73, 74, 75, 77, and 79 are closed. As a result, $N_2$ gas is supplied from the first $N_2$ gas supply source 54 and the second $N_2$ gas supply source 55 through the first continuous $N_2$ gas supply line 66 and the second continuous $N_2$ gas supply line 68 into the processing container 1 to raise the pressure in the processing container 1 and to stabilize the temperature of the semiconductor wafer W on the susceptor 2. At this time, $WCl_6$ gas is supplied from the raw material gas supply source 51 into the buffer tank 80, and thus the pressure in the buffer tank 80 is maintained substantially constant.

Subsequently, a tungsten film is formed through an ALD method using $WCl_6$ gas and $H_2$ gas.

Figure 9:
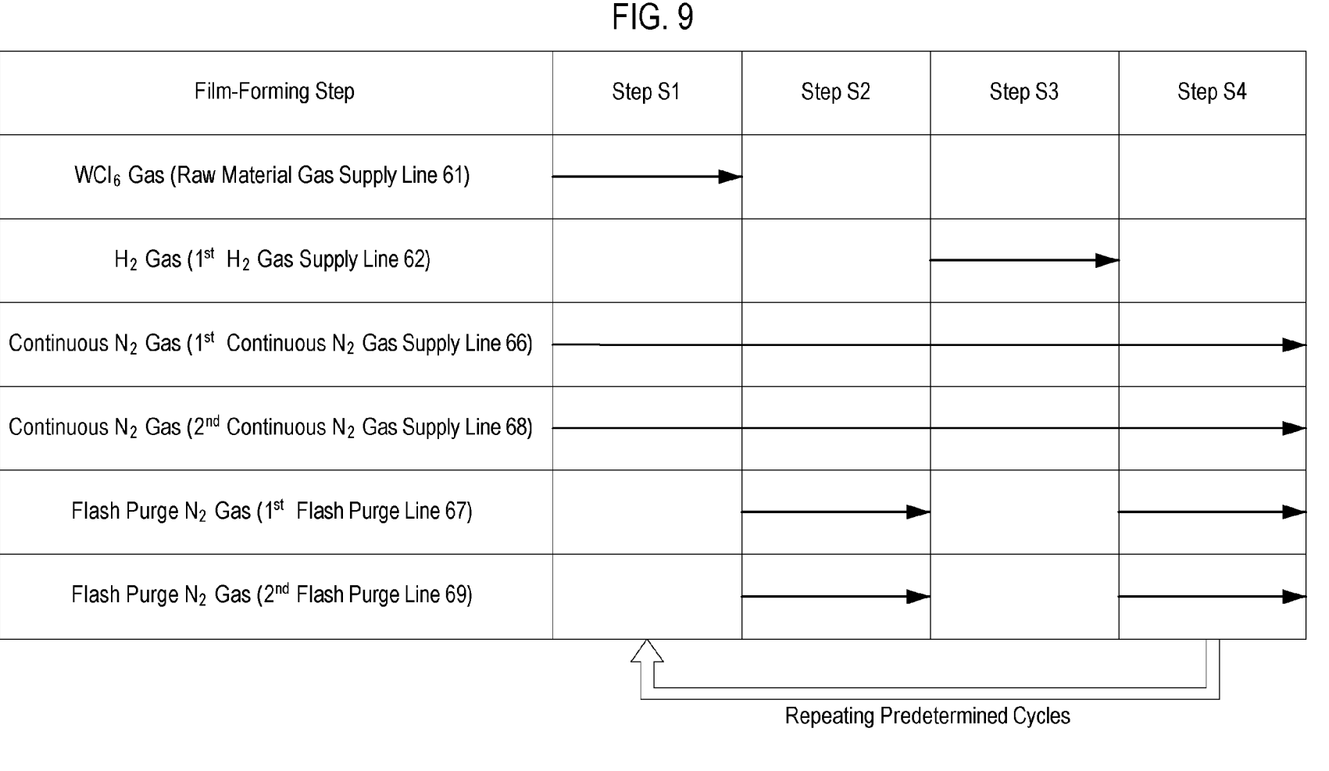
FIG. 9 is a diagram illustrating an exemplary gas supply sequence in an ALD process.

FIG. 9 is a diagram illustrating an exemplary gas supply sequence in an ALD process. The ALD process of FIG. 9 is a process of forming a tungsten film of a desired thickness by repeating a cycle in which a material gas supply step S1, a purge step S2, a reducing gas supply step S3, and a purge step S4 are performed in this order.

The raw material gas supply step S1 is a step of supplying $WCl_6$ gas to the processing space 37. In the raw material gas supply step S1, first, in the state in which the opening/closing valves 76 and 78 are opened, $N_2$ gas is continuously supplied from the first $N_2$ gas supply source 54 and the second $N_2$ gas supply source 55 via the first continuous $N_2$ gas supply line 66 and the second continuous $N_2$ gas supply line 68. In addition, by opening the opening/closing valve 73, $WCl_6$ gas is supplied from the raw material gas supply source 51 via the raw material gas supply line 61 to the processing space 37 in the processing container 1. At this time, the $WCl_6$ gas is once stored in the buffer tank 80 and then supplied into the processing container 1. In addition, in the raw material gas supply step $S_1$, $H_2$ gas may be supplied into the processing container 1 as an additive reducing gas via the second $H_2$ gas supply line 63 extending from the second $H_2$ gas supply source 53. By supplying the reducing gas at the same time as $WCl_6$ gas during the raw material gas supply step S1, the supplied $WCl_6$ gas is activated, and a film-forming reaction is likely to occur during the subsequent reducing gas supply step S3 thereafter. Therefore, it is possible to maintain a high step coverage and to increase the deposited film thickness per cycle to increase the film formation rate. The flow rate of the additive reducing gas may be set to a flow rate at which the CVD reaction does not occur in the raw material gas supply step S1.

The purge step S2 is a step of purging, for example, excessive $WCl_6$ gas in the processing space 37. In the purge step S2, in the state in which the supply of $N_2$ gas through the first continuous $N_2$ gas supply line 66 and the second continuous $N_2$ gas supply line 68 is continued, the opening/closing valve 73 is closed, and the supply of $WCl_6$ gas is stopped. In addition, by opening the opening/closing valves 77 and 79 and supplying $N_2$ gas (flash purge $N_2$ gas) from the first flash purge line 67 and the second flash purge line 69 as well, for example, excessive $WCl_6$ gas in the processing space 37 is purged with a large flow rate of $N_2$ gas.

The reducing gas supply step S3 is a step of supplying $H_2$ gas to the processing space 37. In the reducing gas supply step S3, by closing the opening/closing valves 77 and 79, the supply of the $N_2$ gas from the first flash purge line 67 and the second flash purge line 69 is stopped. In addition, in the state in which the supply of $N_2$ gas through the first continuous $N_2$ gas supply line 66 and the second continuous $N_2$ gas supply line 68 is continued, the opening/closing valve 74 is opened. As a result, $H_2$ gas as a reducing gas is supplied from the first $H_2$ gas supply source 52 via the first $H_2$ gas supply line 62 to the processing space 37. At this time, the $H_2$ gas is once stored in the buffer tank 81 and then supplied into the processing container 1. In the reducing gas supply step S3, $WCl_6$ adsorbed on the semiconductor wafer W is reduced. At this time, the flow rate of the $H_2$ gas may be set to an amount at which a reducing reaction sufficiently occurs.

The purge step S4 is a step of purging excessive $H_2$ gas in the processing space 37. In the purge step S4, in the state in which the supply of $N_2$ gas through the first continuous $N_2$ gas supply line 66 and the second continuous $N_2$ gas supply line 68 is continued, the opening/closing valve 74 is closed, and the supply of $H_2$ gas from the first $H_2$ gas supply line 62 is stopped. In addition, by opening the opening/closing valves 77 and 79 and supplying $N_2$ gas (flash purge $N_2$ gas) from the first flash purge line 67 and the second flash purge line 69 as well, excessive $H_2$ gas in the processing space 37 is purged with a large flow rate of $N_2$ gas.

As described above, it is possible to form a tungsten film in a penetration portion in a semiconductor wafer W in which a TiN film formed on the exposed surface of a silicon film is thicker than that formed on the side wall of the penetration portion.

Incidentally, $WCl_6$ gas has a property of slightly etching a nitride of a transition metal constituting a TiN film and also has a property of allowing the tungsten film to grow selectively from the surface of the nitride of the transition metal constituting the TiN film. Therefore, the TiN film relatively thinly formed on the side wall of the penetration portion is etched and removed. Meanwhile, a part of the TiN film relatively thickly formed on the exposed surface of the silicon film remains. As a result, since the tungsten film is selectively formed on the exposed surface of the silicon film, it is possible to form a tungsten film without generating a void inside the penetration portion.

It shall be understood that the embodiments disclosed herein are examples in all respects and are not restrictive. The above-described embodiments may be omitted, replaced, or modified in various forms without departing from the scope and spirit of the appended claims.

In the above-described embodiments, the case in which a step of forming a TiN film, which is an example of the barrier metal film, and a step of forming a tungsten film are performed using different film-forming apparatuses has been described, but the present disclosure is not limited thereto and the steps may be carried out in the same film-forming apparatus.

According to the present disclosure, it is possible to form a tungsten film without generating a void inside a trench or hole.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a tungsten film in a penetration portion provided in a film formed on a surface of a base so as to expose the surface of the base, the method comprising:

forming a barrier metal film made of a nitride of a transition metal in the penetration portion such that the barrier metal film formed on the exposed surface of the base is thicker than the barrier metal film formed on a side wall of the penetration portion; and selectively forming the tungsten film on the barrier metal film formed on the exposed surface of the base by supplying a tungsten chloride gas and a reducing gas for reducing the tungsten chloride gas to the penetration portion such that the barrier metal film formed on the side wall of the penetration portion is removed by etching while only the barrier metal film formed on the exposed surface of the base remains.

2. The method of claim 1, wherein the barrier metal film is a titanium nitride film or a tantalum nitride film.

3. The method of claim 1, wherein the base is silicon, and the film formed on the surface of the base is a silicon oxide film.

4. The method of claim 1, wherein forming the tungsten film is performed through an ALD method using the tungsten chloride gas and the reducing gas.

5. The method of claim 2, wherein, in forming the tungsten film, the tungsten film is formed at a temperature that is determined depending on a film thickness of the titanium nitride film formed on the side wall of the penetration portion.

6. The method of claim 1, further comprising:

embedding the tungsten film in the penetration portion after the forming the tungsten film.

7. The method of claim 6, wherein the embedding the tungsten film is performed under a process condition different from a process condition in the forming the tungsten film.

8. The method of claim 1, wherein the tungsten chloride gas is $WCl_6$ gas or $WCl_5$ gas.

9. The method of claim 1, wherein the reducing gas is at least one selected from the group of $H_2$ gas, $SiH_4$ gas, $B_2H_6$ gas, and $NH_3$ gas.

10. The method of claim 1, wherein the penetration portion has a cross-sectional shape that is wider at a central portion than at a portion at the same side as a surface of the film formed on the surface of the base.

11. The method of claim 1, wherein the penetration portion is a trench or a hole.

* * * * *